United States Patent
Leisen et al.

(10) Patent No.: US 11,349,050 B2
(45) Date of Patent: May 31, 2022

(54) CONVERSION ELEMENT, OPTOELECTRONIC COMPONENT, METHOD FOR PRODUCING A PLURALITY OF CONVERSION ELEMENTS, METHOD FOR PRODUCING A PLURALITY OF OPTOELECTRONIC COMPONENTS AND METHOD FOR PRODUCING AN OPTOELECTRONIC COMPONENT

(71) Applicant: OSRAM OLED GmbH, Regensburg (DE)

(72) Inventors: Daniel Leisen, Regensburg (DE); Hansjörg Schöll, Bad Abbach (DE); Harald Jäger, Regensburg (DE)

(73) Assignee: OSRAM OLED GMBH, Regensburg (DE)

(*) Notice: Subject to any disclaimer, the term of this patent is extended or adjusted under 35 U.S.C. 154(b) by 0 days.

(21) Appl. No.: 17/047,746

(22) PCT Filed: Apr. 30, 2019

(86) PCT No.: PCT/EP2019/061051
§ 371 (c)(1),
(2) Date: Oct. 15, 2020

(87) PCT Pub. No.: WO2019/219375
PCT Pub. Date: Nov. 21, 2019

(65) Prior Publication Data
US 2021/0151641 A1    May 20, 2021

(30) Foreign Application Priority Data
May 14, 2018 (DE) .......................... 102018111417.6

(51) Int. Cl.
*H01L 33/50* (2010.01)
*H01L 25/16* (2006.01)
*H01L 33/00* (2010.01)

(52) U.S. Cl.
CPC .......... *H01L 33/505* (2013.01); *H01L 25/167* (2013.01); *H01L 33/0095* (2013.01); *H01L 2933/0041* (2013.01)

(58) Field of Classification Search
USPC ...................... 257/79, 98, E33.001, E33.061
See application file for complete search history.

(56) References Cited

U.S. PATENT DOCUMENTS 9,006,007 B2   4/2015   Schneider
9,806,240 B2   10/2017  Goeoetz et al.
(Continued)

FOREIGN PATENT DOCUMENTS

DE   102013207308 A1   10/2014
DE   102013107227 A1   1/2015
(Continued)

*Primary Examiner* — Bo B Jang
(74) *Attorney, Agent, or Firm* — Slater Matsil, LLP (57) ABSTRACT

In an embodiment a conversion element includes a grid having a plurality of openings, a plurality of conversion segments configured to convert a part of a primary radiation into a secondary radiation, wherein the conversion segments are arranged in the openings, wherein the conversion segments include a matrix material into which fluorescent particles are incorporated, wherein the fluorescent particles are sedimented in a sedimented layer and a semiconductor material, a plastic or a metal, wherein the grid terminates flush with the conversion segments.

20 Claims, 7 Drawing Sheets

(56) References Cited

U.S. PATENT DOCUMENTS

| | | | |
|---|---|---|---|
| 9,876,001 | B2 | 1/2018 | Goeoetz et al. |
| 10,253,950 | B2 | 4/2019 | Stoll et al. |
| 10,586,827 | B2 | 3/2020 | Göötz et al. |
| 10,760,771 | B2 * | 9/2020 | Becker .................. H01L 33/507 |
| 2012/0142124 | A1 * | 6/2012 | Yoo ......................... H01L 33/50 |
| | | | 438/16 |
| 2013/0210179 | A1 | 8/2013 | Mei et al. |
| 2015/0003056 | A1 | 1/2015 | Choi et al. |
| 2016/0146434 | A1 | 5/2016 | Mönch et al. |
| 2016/0268488 | A1 | 9/2016 | Goeoetz et al. |
| 2017/0365752 | A1 | 12/2017 | Schwarz et al. |

FOREIGN PATENT DOCUMENTS

| | | |
|---|---|---|
| DE | 102013109031 A1 | 2/2015 |
| DE | 102013112687 A1 | 5/2015 |
| DE | 102014117983 A1 | 6/2016 |
| DE | 102015103055 A1 | 6/2016 |
| DE | 112014004933 T5 | 7/2016 |
| DE | 102015101573 A1 | 8/2016 |
| DE | 112015001180 T5 | 12/2016 |
| WO | 2016079505 A1 | 5/2016 |

\* cited by examiner

CONVERSION ELEMENT, OPTOELECTRONIC COMPONENT, METHOD FOR PRODUCING A PLURALITY OF CONVERSION ELEMENTS, METHOD FOR PRODUCING A PLURALITY OF OPTOELECTRONIC COMPONENTS AND METHOD FOR PRODUCING AN OPTOELECTRONIC COMPONENT

This patent application is a national phase filing under section 371 of PCT/EP2019/061051, filed Apr. 30, 2019, which claims the priority of German patent application 102018111417.6, filed May 14, 2018, each of which is incorporated herein by reference in its entirety.

TECHNICAL FIELD

A conversion element and an optoelectronic component are specified. Furthermore, a method for the production of a plurality of conversion elements, a method for the production of a plurality of optoelectronic components and a method for the production of an optoelectronic component are specified.

SUMMARY

Embodiments provide a conversion element and an optoelectronic component that enables the generation of a particularly good contrast between different pixels and a particularly good colour distribution. Further embodiments provide a method for the production of a plurality of such conversion elements and a method for the production of a plurality of optoelectronic components.

Advantageous embodiments of the conversion element, the optoelectronic component, the method for the production of a plurality of conversion elements and the method for the production of a plurality of optoelectronic components are the subject of the respective dependent claims.

According to at least one embodiment, the conversion element comprises a grid comprising a plurality of openings. The openings of the grid preferably extend in a vertical direction. The vertical direction extends from a first main surface of the grid to a second main surface of the grid, which is opposite to the first main surface. At least one side surface of the opening, which connects the first and second main surface, is preferably formed by the grid. Preferably the openings penetrate the grid completely.

The openings can be arranged preferably matrix-like, i.e., along columns and rows. Preferably, the openings are arranged at grid points of a regular pattern. The openings are preferably arranged laterally spaced apart from one another.

According to at least one embodiment, the conversion element comprises a plurality of conversion segments, each of which is configured to convert at least a part of a primary radiation into a secondary radiation. This is to say that the conversion segments can each convert electromagnetic primary radiation into electromagnetic secondary radiation of another wavelength range. For example, the primary electromagnetic radiation is blue or ultraviolet light. The secondary electromagnetic radiation can be green, yellow or red light, for example.

The conversion segments comprise, for example, a matrix material into which fluorescent particles are incorporated. The matrix material can be a resin, such as an epoxy, or a silicone or a polysilazane or a mixture of these materials. Preferably, the fluorescent particles give the conversion segments and thus the conversion element the wavelength-converting properties. The conversion segments can have different wavelength-converting properties or same wavelength-converting properties.

For example, one of the following materials is suitable for the fluorescent particles: rare earth doped garnets, rare earth doped alkaline earth sulfides, rare earth doped thiogallates, rare earth doped aluminates, rare earth doped silicates, rare earth doped orthosilicates, Rare earth doped chlorosilicates, rare earth doped alkaline earth silicon nitrides, rare earth doped oxynitrides, rare earth doped aluminum oxynitrides, rare earth doped silicon nitrides, rare earth doped sialons, quantum dots. These materials can also be used without matrix material and can be applied directly. The conversion segments can consist of one of the mentioned materials.

According to at least one embodiment, the conversion segments are arranged in the openings. Preferably the conversion segments fill the openings completely. The conversion segments are, at least in regions, preferably in direct and immediate contact with the grid in the region of the openings. The grid surrounds the conversion segments, for example, in a frame-like manner. The openings can have a rectangular, a polygonal, a round or an oval shape.

Preferably, the conversion segments each completely cover the at least one side surface of the openings and terminate preferably flush with the first main surface and the second main surface of the grid. Furthermore, it is possible that the conversion segments protrude beyond the first main surface or the second main surface of the grid and that they are continuous over the first or the second main surface.

According to at least one embodiment, the grid comprises a semiconductor material, a plastic or a metal or consists of one of these materials. The grid preferably forms a mechanically stabilizing component of the conversion element.

According to at least one embodiment, the conversion element comprises a grid comprising a plurality of openings and a plurality of conversion segments configured to convert at least a part of a primary radiation into a secondary radiation, the conversion segments being arranged in the openings, and the grid comprises a semiconductor material, a plastic or a metal or consists of one of these materials.

According to at least one embodiment, the grid has a thickness which is greater than a thickness of the conversion segments. The conversion segments preferably each cover the at least one side surface of the openings in regions. In this case, the conversion segments terminate preferably flush with one of the main surfaces of the grid, while the grid protrudes beyond the conversion segment on the other main surface. For example, the conversion segments have a thickness between 20 micrometres and 100 micrometres inclusive. For example, the thickness of the grid is between 20 micrometres and 120 micrometres inclusive.

For example, the fluorescent particles in the matrix material of the conversion segments are sedimented in a sedimented layer. The sedimented layer preferably has a particularly high density of fluorescent particles. For example, a sedimented layer has a particle density of at least 50 vol %. Thus, a small thickness of the conversion segments can be achieved. The thickness of the conversion segments can be between 10 micrometres and 50 micrometres inclusive. Within the sedimented layer, the density of the fluorescent particles can have a gradient that extends in a vertical direction.

Due to its production process, the sedimented layer typically has a special structure that allows the production process to be detected on the finished sedimented layer. Besides the high particle density mentioned above, the fluorescent particles of the sedimented layer are usually in direct contact with one another. Also a gradient of the density of the fluorescent particles within the sedimented layer in vertical direction is usually generated by sedimentation.

According to at least one embodiment, the grid has a thickness equal to a thickness of the conversion segments. The conversion segments preferably each completely cover the at least one side of the openings. In this case, the conversion segments terminate flush with the first and the second main surface of the grid.

According to at least one embodiment, the grid has a thickness that is less than the thickness of the conversion segments. The conversion segments preferably each completely cover the at least one side surface of the openings. In this case, the conversion segments terminate preferably flush with one of the main surfaces of the grid, while the conversion segments on the other main surface protrude beyond the grid and completely cover this other main surface. For example, the grid has a thickness between 20 micrometres and 100 micrometres inclusive. For example, the conversion segments are between 20 micrometres and 120 micrometres inclusive thick.

According to at least one embodiment, the conversion segments have different fluorescent particles. The primary radiation can be converted by the conversion segments with different fluorescent particles into a different secondary radiation, each of which originates from a different wavelength range. For example, a conversion element has fluorescent particles that convert primary electromagnetic radiation, such as blue light, into secondary electromagnetic radiation, such as red light, while another conversion element converts the same primary electromagnetic radiation, such as blue light, into a different secondary electromagnetic radiation, such as green light. Advantageously, conversion segments can be obtained that generate electromagnetic radiation of different colour locations.

According to at least one preferred embodiment, the grid comprises or consists of silicon. Advantageously, silicon is stable to aging and temperature. In addition, silicon can be easily structured into a grid using processing methods of semiconductor production.

According to at least one embodiment, the grid is coated with a reflective layer. The reflective layer preferably comprises one or more of the following materials or consists of one or more of these materials: Ag, Al, Al:Cu, Rh, Pd, Pt, TCO, for example ITO. Furthermore, the reflective layer can also be configured as a dielectric mirror, which includes layers of silver and silicon oxide, for example. A thickness of the reflecting layer is, for example, at least 10 nanometres or 20 nanometres or 30 nanometres and/or at most 100 nanometres or 200 nanometres or 500 nanometres.

The reflective layer preferably has a reflectivity of at least 90% for primary electromagnetic radiation and/or secondary electromagnetic radiation. Advantageously, the reflective layer increases the light extraction from the conversion element.

According to at least one embodiment, the plurality of openings each have a width and/or length between 20 micrometres and 200 micrometres inclusive. The width or the length corresponds to a minimum or maximum extension of a cross-sectional area of the openings parallel to the main surfaces of the grid. In other words, the width or length is the distance between two opposite sides of the opening.

Furthermore an optoelectronic component is specified. According to at least one embodiment, the optoelectronic component comprises a semiconductor chip which comprises a plurality of pixels. The pixels each emits primary electromagnetic radiation from a radiation exit surface. Preferably, the radiation-emitting semiconductor chip is a pixelated light emitting diode chip. A plurality of radiation exit surfaces of the pixels is preferably formed each by a part of a top surface of the semiconductor chip. The plurality of radiation exit surfaces of the pixels preferably form a radiation exit surface of the semiconductor chip.

According to at least one embodiment, the optoelectronic component comprises a conversion element. The conversion element is preferably the conversion element described above. This is to say that all features and embodiments disclosed in connection with the conversion element described above are therefore also applicable in connection with the conversion element described here and vice versa.

According to at least one embodiment, the conversion element is arranged on the semiconductor chip. The conversion element is preferably arranged on the radiation exit surface of the semiconductor chip. Preferably, the main surfaces of the grid of the conversion element extends parallel to the radiation exit surface.

According to at least one embodiment, each pixel is assigned to a conversion segment. Preferably, one conversion segment is arranged above one pixel. For example, one respective radiation exit surface of a pixel is covered by a light entrance surface of a conversion segment. In particular, the conversion segments each are arranged above the radiation exit surface of the pixels. Advantageously, the primary radiation emitted by the pixels can be converted by one respective conversion segment into secondary radiation of a different wavelength range. A crosstalk into other pixel regions is advantageously at least reduced by the grid.

According to at least one embodiment, the grid is in contact with the radiation exit surface by means of a transparent adhesive. The transparent adhesive provides an adhesion between the conversion element and the semiconductor chip. It is possible that only the grid is in contact with the radiation exit surface by means of the transparent adhesive and that the conversion segments have a distance to the radiation exit surface, for example if the grid has a greater thickness than the conversion elements. Advantageously, the conversion segments are thermally better decoupled from the semiconductor chip.

According to at least one embodiment, the conversion segments are in contact with the radiation exit surface by means of a transparent adhesive. In this case, the conversion segments are in contact with the radiation exit surface in the region of the openings by means of a transparent adhesive. In this case, the thermal connection of the conversion segments to the semiconductor chip is particularly good.

According to at least one embodiment, an adhesion promoter is arranged between the grid and the conversion segments. The adhesion promoter preferably comprises or consists of a silicone. Fluorescent particles are preferably incorporated into the silicone. The fluorescent particles give the silicone wavelength-converting properties. This improves the adhesion between the conversion segments and the grid. Preferably, the silicone of the adhesion promoter has the same fluorescent particles as the adjacent conversion element.

One embodiment of the conversion element and the optoelectronic component described here is, among other things, to use a grid into which conversion segments are inserted. The conversion segments can preferably be arranged above one pixel of a pixelated semiconductor chip. The grid preferably prevents crosstalk of emitted primary radiation of one pixel to adjacent pixels. This results in an improved contrast and a better colour distribution above the component. The conversion segments can be generated by sedimentation, resulting in a particularly good thermal bond to the semiconductor chip. Furthermore, the conversion segments can contain different fluorescent particles. Thus, different colour locations of the light emitted by the pixels of the component can be generated.

In addition, a method for the production of a plurality of conversion elements is disclosed, with which a conversion element described here can be produced. All features and embodiments disclosed in connection with the conversion element are therefore also applicable in connection with the method and vice versa.

According to at least one embodiment of the method, a grid material is provided. The grid material preferably comprises a semiconductor material, a plastic or a metal or consists of one of these materials. If the grid material includes or consists of a semiconductor material, a thickness of the grid material is for example 100 micrometres to 200 micrometres inclusive. This has the advantage of making the grid material easier to handle in the subsequent method steps.

According to at least one embodiment of the method, a plurality of openings are generated in the grid material. The openings are preferably arranged in a matrix-like manner or form a matrix with rows and columns. In particular, it can be an N×M matrix, i.e., with N rows and M columns, where N and M is a natural number greater than or equal to 3. For example, a matrix is at least 3×3 in size or at most 1000× 1000 in size. In particular, the grid material can have a plurality of such matrices, which are arranged spaced apart from one another.

The grid material preferably comprises a first main surface opposite a second main surface, the vertical direction being perpendicular to the main surfaces of the grid material. The grid material separating different openings within the matrix preferably has a thickness parallel to the main surfaces of the grid material which is smaller than a thickness of the grid material between adjacent matrices.

The openings preferably extend in a vertical direction through the grid material. The openings preferably do not penetrate the grid material completely, at least not initially. For example, a depth of the openings in the grid material is 20 micrometres to 50 micrometres inclusive.

According to at least one embodiment of the method, a conversion material is introduced into the opening, wherein each opening into which a conversion material has been introduced forms a conversion segment. The conversion material is preferably in a flowable form when it is introduced. In this case, the conversion material is cured after the introduction and forms a conversion segment in each case.

It is possible that the conversion material is completely filled into the openings. It is also possible to apply the conversion material to the grid material after the openings are filled so that the conversion material covers the openings and a main surface of the grid material.

According to at least one embodiment of the method, the grid material is separated with the conversion material into the plurality of conversion elements, wherein the separated grid material forms a grid. The separation is preferably performed by cuts substantially perpendicular to the first and second main surface of the grid material between adjacent matrices. Preferably, the cuts are made through the wider grid material between adjacent matrices. The cuts are produced by a laser or a saw blade, for example.

According to at least one embodiment, the openings are produced by a lithographic process. For example, regions of the grid material are covered by a photoresist where the grid material is not removed. The openings are preferably produced by a wet chemical etching process, where the grid material is removed in the regions that are not covered by the photoresist. If such a lithographic process is applied, the grid material preferably comprises or consists of a semiconductor material. Thus, a particularly good aspect ratio can be achieved.

According to at least one embodiment, the grid material is produced by an injection molding or micro embossing process or by erosion. If an injection molding or micro embossing process is used, the grid material preferably comprises or consists of a plastic material. If eroding is used, the grid material preferably comprises or consists of a metal.

According to at least one embodiment, the conversion material is introduced into the openings by dispensing, jetting, printing, spraying with a mask or squeegee. In particular, the conversion material can be introduced one after the other into each opening by means of dispensing or jetting. It is advantageous if the conversion material contains different fluorescent particles.

According to at least one embodiment, the grid material is applied to an intermediate carrier after the openings have been produced. The conversion segments and the grid material are preferably in direct contact with the intermediate carrier. After the separation step, the intermediate carrier is preferably removed.

According to at least one embodiment, fluorescent particles are sedimented in a matrix material after they have been introduced into the openings of the grid material. A grid material is preferred where the openings do not completely penetrate the grid material. Preferably, the fluorescent particles are sedimented in the flowable matrix material. The fluorescent particles sink vertically due to the gravitational force. The sinking of the fluorescent particles can be accelerated by centrifugation, for example. The sedimentation usually forms a sedimented layer with a dense arrangement of fluorescent particles, over which a layer of matrix material is arranged, which has significantly fewer fluorescent particles or is substantially free of fluorescent particles. Preferably, the conversion material is cured after sedimentation and forms a conversion segment in each case.

According to at least one embodiment, the grid material is thinned from the first main surface of the grid material after sedimentation. In this process, the openings preferably do not penetrate the grid material completely. The first main surface of the grid material is formed by the main surface that is penetrated by the openings. Preferably, the grid material is thinned so that the first main surface of the grid material terminates flush with the conversion material. Alternatively, it is possible that the grid material is thinned from the first main surface before sedimentation.

Additionally, it is possible to thin the grid material before or after sedimentation from the second main surface of the grid material. The second main surface is preferably formed by a bottom surface of the grid material which is not penetrated by the openings. The grid material is preferably thinned to such an extent that the bottom surface is completely removed and the openings penetrate the grid material completely. The second main surface of the grid material then preferentially terminates flush with the conversion material.

A thickness of the grid material after thinning of the first main surface of the grid material and/or the second main surface of the grid material can be, for example, between 20 micrometres and 50 micrometres inclusive.

In addition, the grid material and conversion material can be further thinned in regions from the second main surface of the grid material. The region to be further thinned is preferably below a matrix of openings. In particular, the grid material located between adjacent matrices is not further thinned. Further thinning will preferably create a recess on the second main surface of the grid material.

Furthermore, a method for the production of a plurality of optoelectronic components is specified, with which an optoelectronic component described here can be produced. All features and embodiments disclosed in connection with the optoelectronic component are therefore also applicable in connection with the method and vice versa.

According to at least one embodiment, a plurality of semiconductor chips is provided, each comprising a plurality of pixels.

According to at least one embodiment, one conversion element is applied to each semiconductor chip. Preferably, the conversion element is produced according to the above described method.

According to at least one embodiment, each pixel is assigned to a conversion segment. Since the conversion segments are combined in a grid, an adjustment of the conversion segments above the pixels is advantageously simplified.

According to at least one embodiment, the pixels are assigned to the conversion segments actively or passively. In an active assignment, for example, the conversion element is positioned over a semiconductor chip using a "pick-and-place" method, so that one conversion segment is arranged over each pixel. Preferably, a light input surface of a conversion segment covers a radiation output surface of a pixel, preferably completely.

In a passive assignment, the semiconductor chip is positioned in the recess in the second main surface of the grid material. Preferably, the semiconductor chip has the same dimensions parallel to the main surface of the grid. Preferably, the extensions of the semiconductor chip parallel to the main surface of the grid are smaller than the extensions of the recess. The semiconductor chip can thus be inserted into the recess with a perfect fit.

Furthermore, a method for producing an optoelectronic component is specified. All features and embodiments disclosed in connection with the optoelectronic component are therefore also applicable in connection with the method and vice versa.

According to at least one embodiment, the method comprises the step of applying a structured sacrificial layer on the semiconductor chip, wherein the structured sacrificial layer has cavities. Preferably, the semiconductor chip is available as a wafer. The cavities penetrate the sacrificial layer preferably completely in vertical direction. The structured sacrificial layer is formed from a photoresist, for example.

In a first step, the photoresist can be applied over the semiconductor chip and initially cover it completely. The cavities can then preferably be produced by wet chemical etching. The cavities then penetrate the structured sacrificial layer completely and expose the semiconductor chip. Also, the photoresist can be applied to the semiconductor chip by means of a mask so that the semiconductor chip is exposed in the region of the cavities.

According to at least one embodiment, the conversion material is introduced into the cavities, wherein the conversion material is preferably assigned to one pixel each. The cavities are preferably located above each pixel of the semiconductor chip. The material of the structured sacrificial layer is thus preferably located between adjacent pixels.

The conversion material can be cured after insertion and forms a conversion segment each.

According to at least one embodiment, the structured sacrificial layer is removed again. The material removal of the structured sacrificial layer can preferably be produced by chemical etching. The removal of the sacrificial layer preferably creates gaps between adjacent conversion segments.

According to at least one embodiment, a grid material is introduced into the gap. The gaps are preferably filled with a metallic material, for example, by means of a chemical vapor deposition (CVD) or a physical vapor deposition (PVD) process.

Alternatively, the gaps can be filled with a plastic material by one of the following deposition processes: sputtering, PVD, evaporation.

In particular, the gaps can be filled with a silicone containing $TiO_2$ particles.

It is possible that the materials introduced into the gap also cover the conversion segments. In this case, the materials introduced into the gap are preferably removed from the conversion elements, for example by grinding back.

BRIEF DESCRIPTION OF THE DRAWINGS

In the following, the conversion element described here, the optoelectronic component as well as the method described here for producing a plurality of conversion elements and the method for producing a plurality of optoelectronic components are explained in detail by means of exemplary embodiments and the corresponding figures.

DETAILED DESCRIPTION OF ILLUSTRATIVE EMBODIMENTS

Identical, similar or similarly acting elements are marked with the same reference signs in the figures. The figures and the proportions of the elements shown in the figures to each other are not to be considered as true to scale. Rather, individual elements can be oversized for better representability and/or for better comprehensibility.

Figure 1:
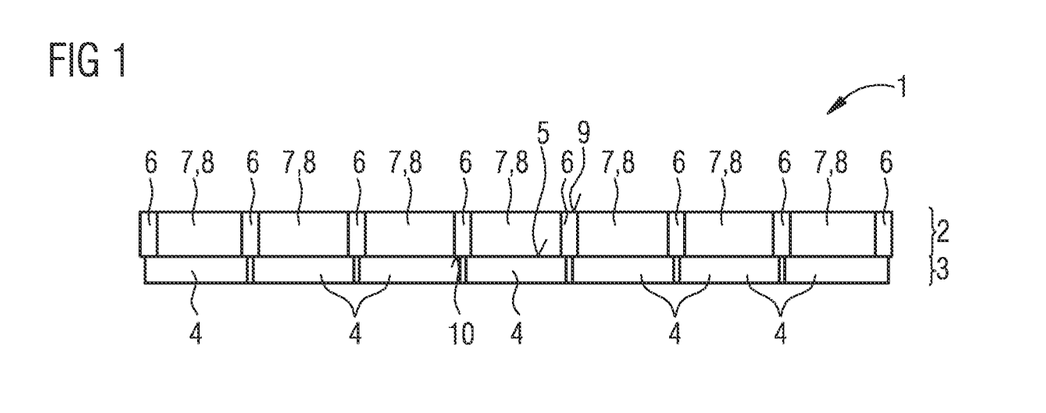
FIGS. 1-6 show schematic sectional views of an optoelectronic component according to an exemplary embodiment each.

According to the exemplary embodiment of FIG. 1, the optoelectronic component 1 comprises a semiconductor chip 3, which has a plurality of pixels 4 and a radiation exit surface 5. On the semiconductor chip 3 a conversion element 2 is arranged, which has a grid 6, which comprises a plurality of openings 7. The conversion segments 8 are arranged in each of the openings. The conversion segments 8 are each assigned to a pixel 4. The material of the grid 6 is arranged between adjacent pixels 4 and separates the conversion segments 8 from one another.

In the present case, the grid 6 and the conversion segments 8 are in direct contact with the radiation exit surface 5. In addition, the conversion segments 8 each terminates flush with a first main surface 9 and a second main surface 10 of the grid 6.

Figure 2:
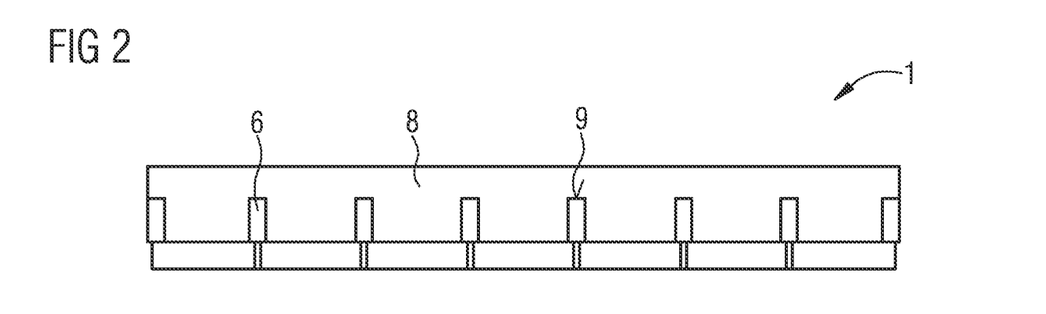

The exemplary embodiment shown in FIG. 2 represents an optoelectronic component 1, in which the conversion segments 8 protrude above the first main surface 9 of the grid 6 and are contiguously formed above the first main surface 9.

Figure 3:
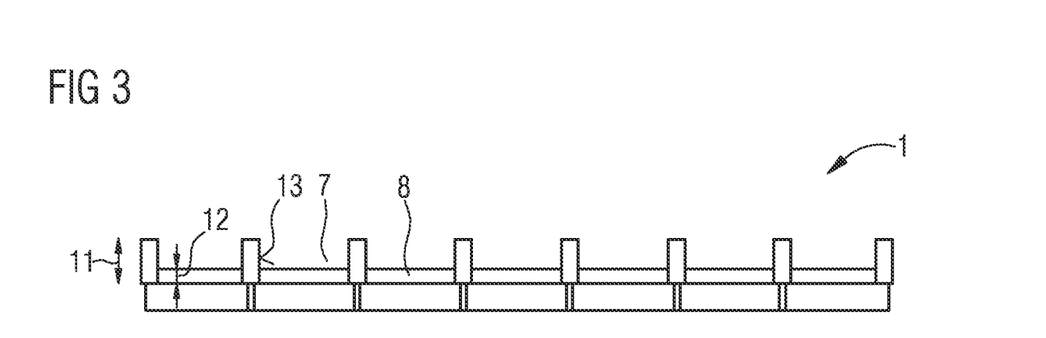

In contrast to the exemplary embodiment shown in FIG. 3, the exemplary embodiment shown in FIG. 3 shows an optoelectronic device 1 in which the grid 6 has a thickness 11 which is greater than a thickness 12 of the conversion segments 8. The conversion segments 8 preferably have fluorescent particles in a matrix material which are sedimented in a sedimentation layer. The conversion segments thus cover the side surfaces 13 of the openings 7 in regions.

Figure 4:
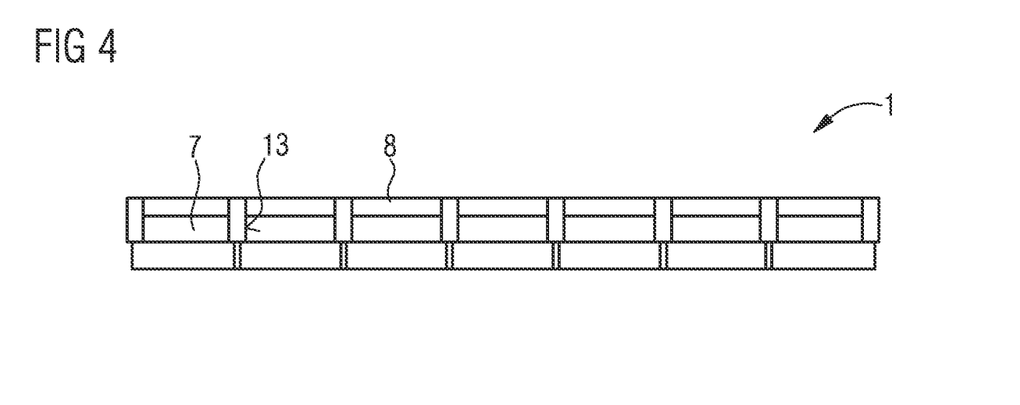

FIG. 4 shows an optoelectronic device 1, which has conversion segments 8, analogous to FIG. 3, which cover the side surfaces 13 of the openings 7 in regions. The conversion element 2, on the other hand, is rotated by 180° so that the conversion segments 8 have a distance to the semiconductor chip 2.

Figure 5:
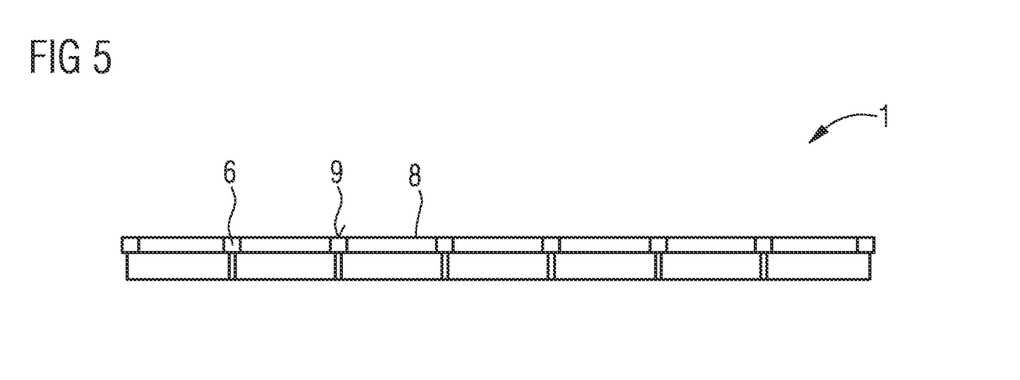

In contrast to FIG. 3, FIG. 5 shows an optoelectronic component 1 in which the grid 6 is thinned in such a way that the first main surface 9 of the grid 6 terminates flush with the sedimented conversion segment 8.

Figure 6:
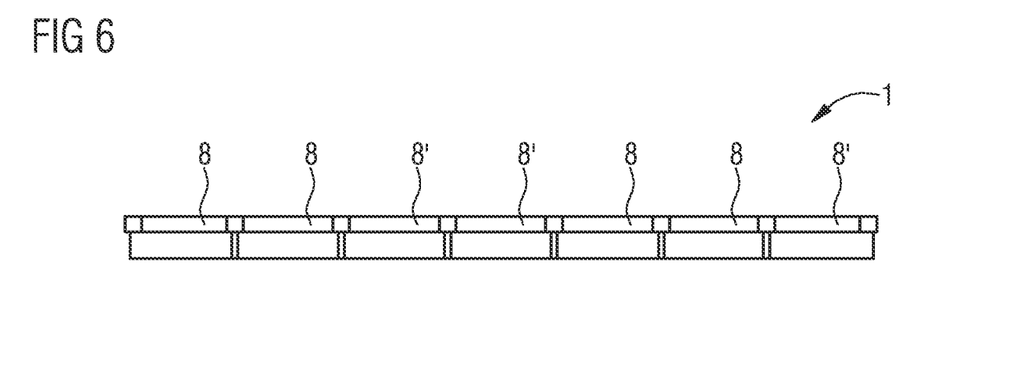

FIG. 6 shows an optoelectronic device 1, in which, in contrast to FIG. 5, the conversion segments 8, 8' each have different fluorescent particles.

Figure 7:
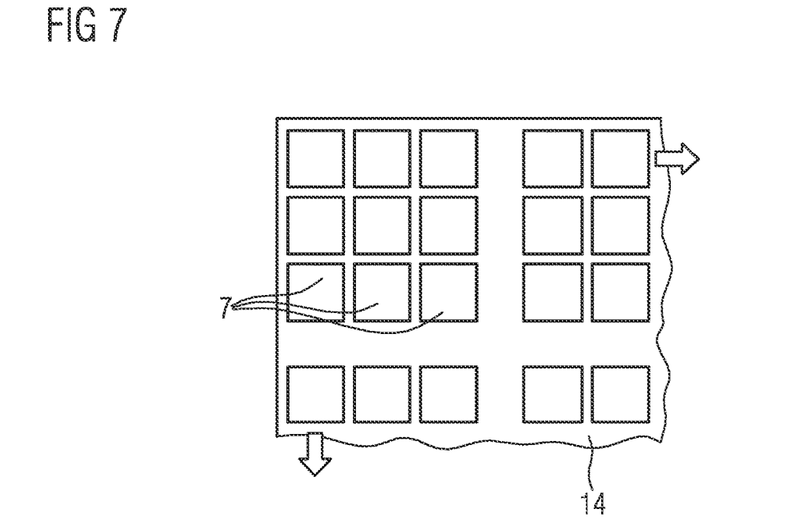
FIG. 7 shows a schematic top view of a method stage in the production of a plurality of conversion elements according to an exemplary embodiment.
Figure 8:
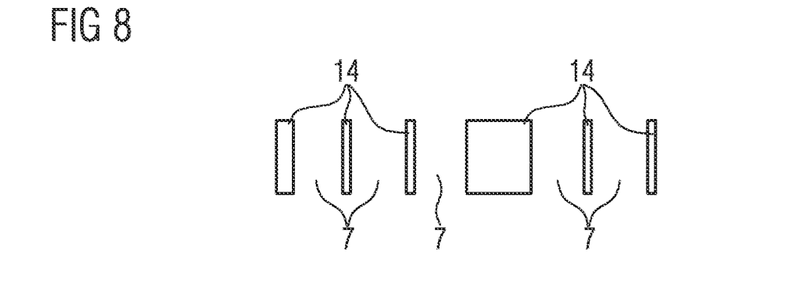
FIGS. 8-13 show schematic sectional views of method stages in the production of a plurality of conversion elements according to an exemplary embodiment.

In the method according to the exemplary embodiment in FIGS. 7, 8, 9, 10, 11, 12 and 13, a grid material 14 is provided in a first process step (FIGS. 7 and 8). A plurality of openings 7 are produced in the grid material 14, which penetrate the grid material 14 completely. The openings 7 preferably form a matrix with rows and columns. The matrix in this case is a 3×3 matrix. The grid material has a plurality of such matrices, which are arranged spaced apart from one another. The grid material, which separates different segments within the matrix, is thinner than the grid material between adjacent matrices.

Figure 9:
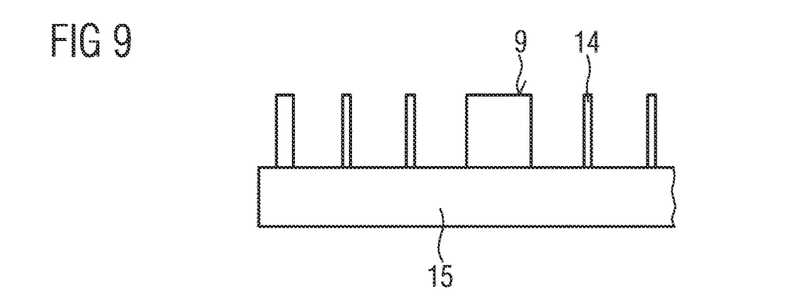
Figure 10:
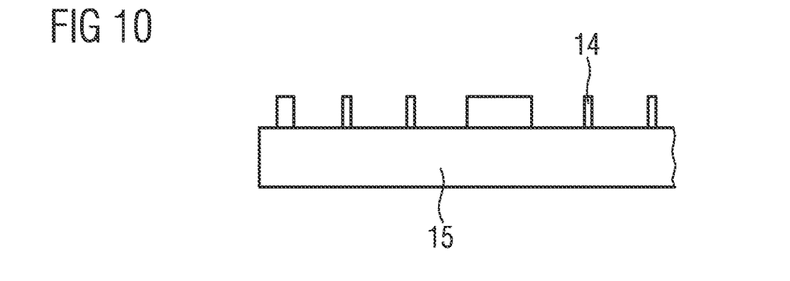

In a further step, the grid material 14 is applied to an intermediate carrier 15 as shown in FIG. 9 and then thinned from a first main surface 9 of the grid material 14 as shown in FIG. 10. A bottom surface of the openings 7 is formed by the intermediate carrier 15. Alternatively, thinning from the first main surface 9 of the grid material 14 can be performed in a later step of the method.

Figure 11:
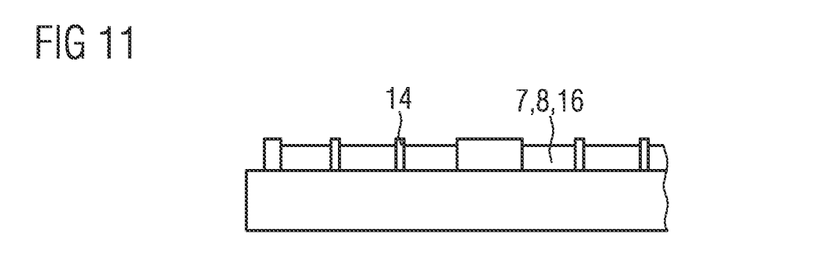

As shown schematically in FIG. 11, a conversion material 16 is introduced into the openings 7 by dispensing, jetting, printing, spraying with a mask or squeegee and cured. Each opening 7, into which a conversion material 16 has been introduced, forms a conversion segment 8. The conversion segments 8 terminate flush with the grid material 14 in the vertical direction.

Figure 12:
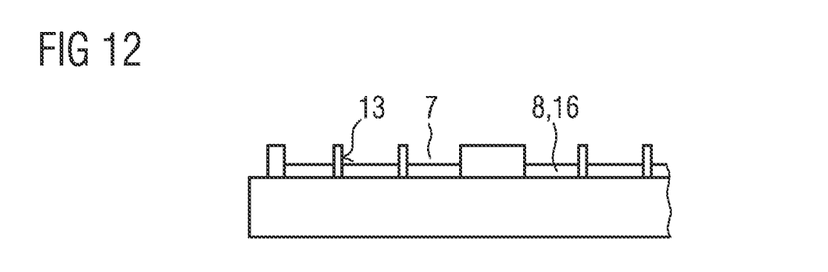

As shown in FIG. 12, the fluorescent particles in this exemplary embodiment are sedimented in the matrix material 16 after the introduction. The matrix material 16 and the conversion segments 8 cover the side surfaces 13 of the openings 7 in regions. The grid material 14 thus has a thickness that is greater than the thickness of the conversion segments 8.

Figure 13:
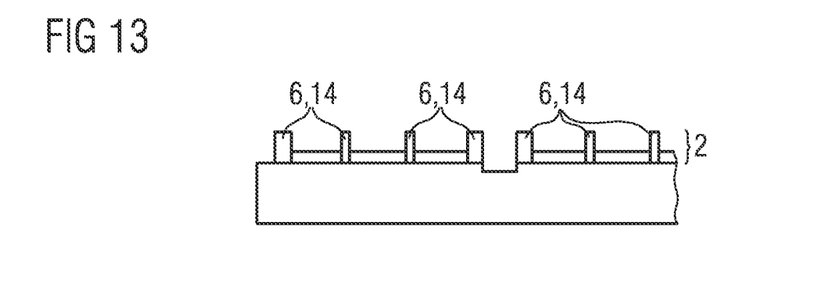

In a further step, the arrangement as shown in FIG. 12 is separated into the plurality of conversion elements 2 as shown in FIG. 13. The cuts are made through the thicker grid material 14 between adjacent matrices. The separated grid material 14 forms the grid 6.

Figure 14:
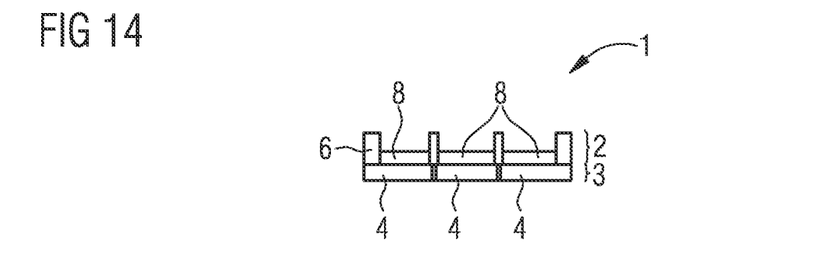
FIG. 14 is a schematic sectional view of a method stage in the production of a plurality of optoelectronic components according to an exemplary embodiment.

In the method according to the exemplary embodiment of FIG. 14, a plurality of semiconductor chips 3, each comprising a plurality of pixels 4, is provided. On these semiconductor chips 3, the separated grids 6 with the conversion segments 8 are applied, wherein the grids 6 with the conversion segments 8 are previously detached from the intermediate carrier 15. Thereby, each pixel 4 is assigned a conversion segment 8.

Figure 15:
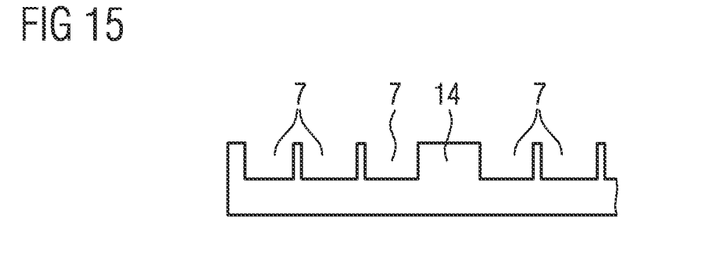
FIGS. 15-19 show schematic sectional views of method stages in the production of a plurality of conversion elements according to an exemplary embodiment.

Analogous to the method step shown in FIGS. 7 and 8, a grid material 14 is provided in a first process step according to FIG. 15. A plurality of openings 7 are produced in the grid material 14, which at least initially do not penetrate the grid material 14 completely but only partially. A bottom surface of the openings 7 is formed by the grid material 14.

Figure 16:
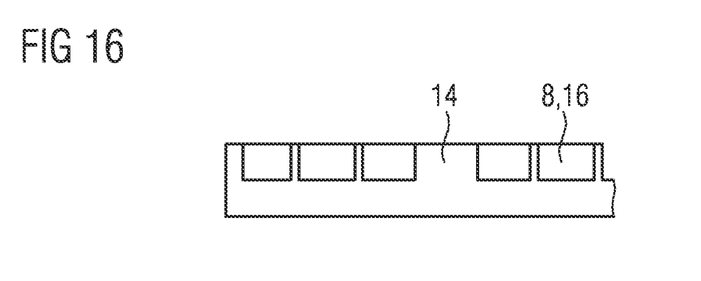
Figure 17:
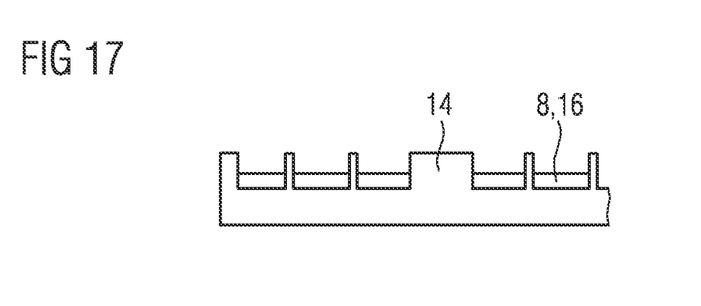

The steps according to FIGS. 16 and 17 are performed analogous to the steps shown in FIGS. 11 and 12 and already described in connection with these figures.

Figure 18:
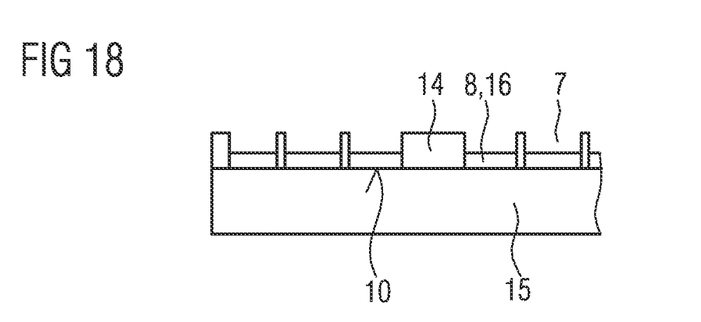

In a further step, the grid material 14 is thinned to such an extent that the bottom surface is completely removed and the openings 7 penetrate the grid material 14 completely, as shown in FIG. 18. The second main surface 10 of the grid material 14 terminates then flush with the conversion material 16. The grid material 14 with the conversion segments 8 is arranged on an intermediate carrier 15.

Figure 19:
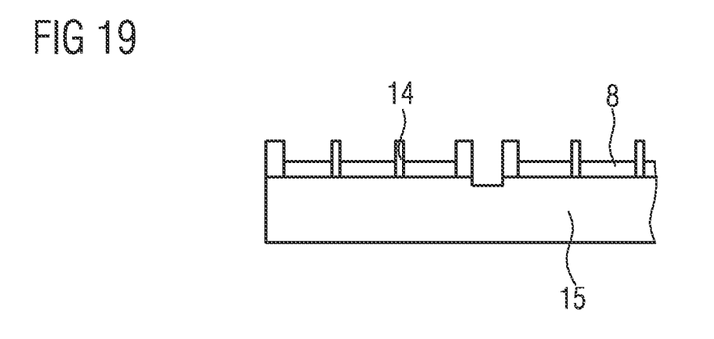

The step according to FIG. 19 is performed analogously to the step shown in FIG. 13 and already described in connection with FIG. 13.

Figure 20:
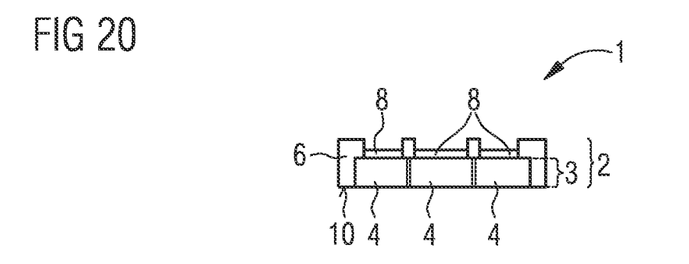
FIG. 20 is a schematic sectional view of a method stage in the production of a plurality of optoelectronic components according to an exemplary embodiment.

Furthermore, the grid material 14 and the conversion material 16 can be thinned further in regions from the second main surface 10 of the grid material 14, as shown in FIG. 20. The region to be further thinned lies below a matrix of openings 7, and in particular, the grid material 14, which is arranged between adjacent matrices, is not further thinned. Further thinning thus creates a recess at the second main surface 10 of the grid material 14.

In the method according to the exemplary embodiment in FIG. 20, a plurality of semiconductor chips 3, each comprising a plurality of pixels 4, is provided. The semiconductor chips 3 are inserted into the recess on the second main surface 10 of the grid material 14.

Figure 21:
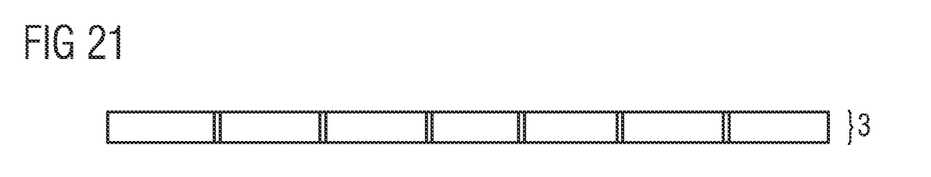
FIGS. 21-25 show schematic sectional views of process stages in the manufacture of an optoelectronic component according to an exemplary embodiment.

In the method according to the exemplary embodiment of FIGS. 21 to 25, a semiconductor chip 3 is provided in a first method step, as shown in FIG. 21.

Figure 22:
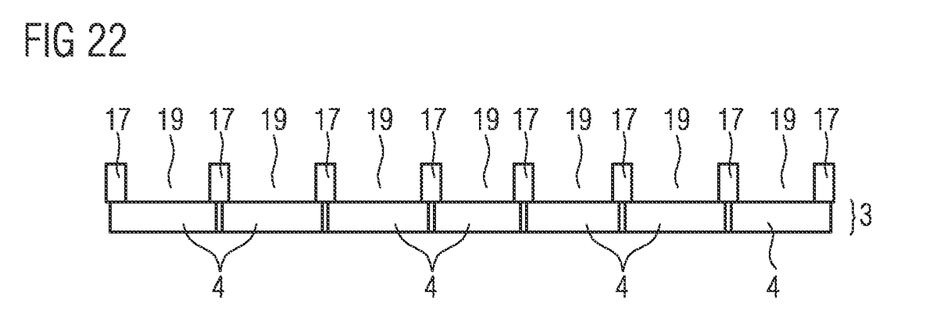

In a next step a structured sacrificial layer 17 is provided on the semiconductor chip 3, the structured sacrificial layer 17 has cavities 19 (FIG. 22). The semiconductor chip 3 is exposed in the region of the pixels 4. The sacrificial layer is arranged above adjacent pixels 4.

Figure 23:
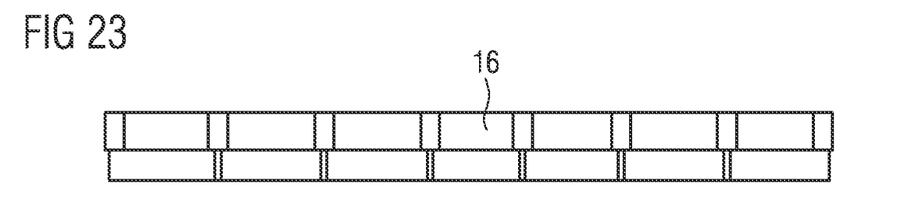
Figure 24:
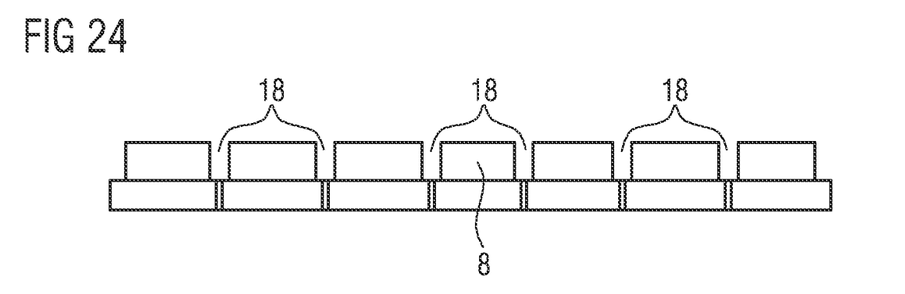
Figure 25:
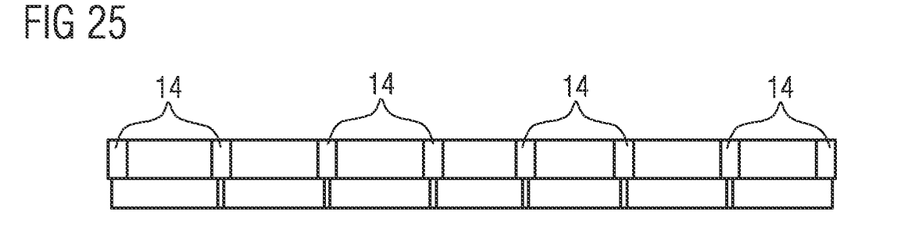

In a further step, as shown in FIG. 23, a conversion material 16 is introduced into the cavities 19. Then the sacrificial layer 17 is removed (FIG. 24). This removal creates a gap 18 between adjacent conversion segments 8. In a further step, the gaps 18 are filled with a grid material 14 (FIG. 25).

The invention is not limited to the description based on the exemplary embodiments. Rather, the invention comprises each new feature as well as each combination of features, which in particular includes each combination of features in the claims, even if this feature or this combination itself is not explicitly stated in the claims or exemplary embodiment.

The invention claimed is:

1. An optoelectronic component:
a semiconductor chip comprising a plurality of pixels and configured to emit a primary radiation from a radiation exit surface; and
a conversion element comprising:
a grid comprising a plurality of openings; and
a plurality of conversion segments configured to convert a part of the primary radiation into a secondary radiation,
wherein the conversion segments are arranged in the openings,
wherein the conversion segments comprise a matrix material into which fluorescent particles are incorporated,
wherein the fluorescent particles are sedimented in a sedimented layer,
wherein the grid comprises a semiconductor material, a plastic or a metal,
wherein the grid terminates flush with the conversion segments,
wherein the conversion element is arranged on the semiconductor chip, and
wherein each pixel is assigned to a conversion segment of the plurality of conversion segments.

2. The optoelectronic component according to claim 1, wherein the grid has a thickness greater than a thickness of the conversion segments,
wherein the grid has a thickness equal to a thickness of the conversion segments, or
wherein the grid has a thickness smaller than a thickness of the conversion segments.

3. The optoelectronic component according to claim 1, wherein the conversion segments have different fluorescent particles.

4. The optoelectronic component according to claim 1, wherein the grid comprises silicon.

5. The optoelectronic component according to claim 1, wherein the grid is coated with a reflective layer.

6. The optoelectronic component according to claim 1, wherein each opening of the plurality of openings has a width and/or a length between 20 micrometres inclusive and 200 micrometres inclusive.

7. The optoelectronic component according to claim 1, wherein the grid is in contact with the radiation exit surface by a transparent adhesive.

8. The optoelectronic component according to claim 1, wherein the conversion segments are in contact with the radiation exit surface by a transparent adhesive.

9. The optoelectronic component according to claim 1, further comprising an adhesion promoter arranged between the grid and the conversion segments.

10. A method for producing a plurality of conversion elements, the method comprising:
providing a grid material;
generating a plurality of openings in the grid material;
introducing a conversion material into the openings, wherein each opening into which the conversion material has been introduced forms a conversion segment; and
separating the grid material with the conversion material into the plurality of conversion elements, wherein the separated grid material forms a grid,
wherein the conversion segments comprise a matrix material into which fluorescent particles are incorporated,
wherein the fluorescent particles are sedimented in the matrix material after being introduced into the openings, and
wherein the grid material is thinned after sedimentation from a first main surface of the grid material.

11. The method according to claim 10, wherein the openings are produced by a lithographic process.

12. The method according to claim 11, wherein the grid material is produced by an injection molding, a micro embossing process or by eroding.

13. The method according to claim 12, wherein the conversion material is introduced into the openings by dispensing, jetting, printing, spraying with mask or squeegee.

14. The method according to claim 13, wherein the grid material is applied to an intermediate carrier after the openings have been produced.

15. A method for producing an optoelectronic component, the method comprising:
depositing a structured sacrificial layer on a semiconductor chip, wherein the sacrificial layer has cavities, wherein each cavity is assigned to a pixel;
applying a conversion material into the cavities;
removing the structured sacrificial layer; and
applying a grid material to areas where the sacrificial layer has been removed.

16. A conversion element comprising:
a grid comprising a plurality of openings; and
a plurality of conversion segments configured to convert a part of a primary radiation into a secondary radiation,
wherein the conversion segments are arranged in the openings,
wherein the conversion segments comprise a matrix material into which fluorescent particles are incorporated,
wherein the fluorescent particles are sedimented in a sedimented layer,
wherein the grid comprises silicon, and
wherein the grid terminates flush with the conversion segments.

17. The conversion element according to claim 16, wherein the grid has a thickness greater than a thickness of the conversion segments.

18. The conversion element according to claim 16, wherein the grid has a thickness smaller than a thickness of the conversion segments.

19. A method for producing a plurality of optoelectronic components, the method comprising:
providing a plurality of semiconductor chips, each comprising a plurality of pixels; and
applying one conversion element to one semiconductor chip, each conversion element according to claim 16,
wherein each pixel is assigned to a respective conversion segment of the plurality of conversion segments.

20. The method according to claim 19, wherein the pixels are actively or passively assigned to the conversion segments.

* * * * *